United States Patent
Chern et al.

(10) Patent No.: US 8,885,787 B2
(45) Date of Patent: *Nov. 11, 2014

(54) CLOCK AND DATA RECOVERY USING LC VOLTAGE CONTROLLED OSCILLATOR AND DELAY LOCKED LOOP

(71) Applicant: Taiwan Semiconductor Manufacturing Company, Ltd., Hsinchu (TW)

(72) Inventors: Chan-Hong Chern, Palo Alto, CA (US); Chih-Chang Lin, San Jose, CA (US); Ming-Chieh Huang, San Jose, CA (US); Fu-Lung Hsueh, Cranbury, NJ (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/058,506

(22) Filed: Oct. 21, 2013

(65) Prior Publication Data
US 2014/0044225 A1    Feb. 13, 2014

Related U.S. Application Data

(63) Continuation of application No. 13/045,788, filed on Mar. 11, 2011, now Pat. No. 8,588,358.

(51) Int. Cl.
| | |
|---|---|
| *H04L 7/00* | (2006.01) |
| *H04L 7/033* | (2006.01) |
| *H03L 7/08* | (2006.01) |
| *H03L 7/081* | (2006.01) |
| *H03L 7/113* | (2006.01) |

(52) U.S. Cl.
CPC .............. *H04L 7/033* (2013.01); *H04L 7/0337* (2013.01); *H03L 7/0807* (2013.01); *H03L 7/081* (2013.01); *H03L 7/113* (2013.01)
USPC ........... 375/371; 375/374; 375/373; 375/372; 375/354; 375/316; 375/219

(58) Field of Classification Search
USPC .......... 375/374, 373, 372, 371, 354, 316, 219
See application file for complete search history.

(56) References Cited

U.S. PATENT DOCUMENTS

| | | | |
|---|---|---|---|
| 6,026,134 | A | 2/2000 | Duffy et al. |
| 6,249,159 | B1 | 6/2001 | Johnson |
| 6,259,278 | B1 | 7/2001 | Huang |
| 6,442,225 | B1 | 8/2002 | Huang |

(Continued)

OTHER PUBLICATIONS

Muthali, Harish S., et al., "A CMOS 10-Gb/s SONET Transceiver", IEEE Journal of Solid-State Circuits, vol. 39, No. 7, Jul. 2044, pp. 1026-1033.

*Primary Examiner* — Zewdu Kassa
(74) *Attorney, Agent, or Firm* — Lowe Hauptman & Ham, LLP

(57) ABSTRACT

A clock and data recovery (CDR) circuit includes an inductor-capacitor voltage controlled oscillator (LCVCO) configured to generate a clock signal with a clock frequency. The CDR circuit further includes a delay locked loop (DLL) configured to receive the clock signal from the LCVCO and generate multiple clock phases and a first charge pump configured to control the LCVCO. The CDR circuit further includes a phase detector configured to receive a data input and the multiple clock phases from the DLL, and to align a data edge of the data input and the multiple clock phases.

20 Claims, 4 Drawing Sheets

(56) References Cited

U.S. PATENT DOCUMENTS

| | | |
|---|---|---|
| 6,456,128 B1 | 9/2002 | Nakamura |
| 6,560,306 B1 | 5/2003 | Duffy et al. |
| 7,078,938 B2 | 7/2006 | Kim |
| 7,136,443 B2 | 11/2006 | Vallet et al. |
| 7,330,058 B2 | 2/2008 | Lin |
| 7,492,849 B2 | 2/2009 | On et al. |
| 2007/0001713 A1 | 1/2007 | Lin |
| 2007/0058768 A1* | 3/2007 | Werner .................. 375/376 |
| 2009/0262876 A1* | 10/2009 | Arima et al. .................. 375/374 |

* cited by examiner

CLOCK AND DATA RECOVERY USING LC VOLTAGE CONTROLLED OSCILLATOR AND DELAY LOCKED LOOP

PRIORITY CLAIM

The present application is a continuation of U.S. application Ser. No. 13/045,788, filed Mar. 11, 2011, which is incorporated by herein by reference in its entirety.

RELATED APPLICATION

The present application is related to U.S. application Ser. No. 12/835,130, entitled "PHASE-LOCK ASSISTANT CIRCUITRY" filed on Jul. 13, 2010, which is incorporated herein by reference.

TECHNICAL FIELD

The present disclosure relates generally to an integrated circuit, and more particularly to a clock and data recovery (CDR) circuit.

BACKGROUND

A Clock Data Recovery (CDR) circuit needs to track data rate variations. A conventional Phase Locked Loop (PLL)-based CDR circuit intrinsically has a limit in tracking large data rate variations. The PLL-based CDR circuit utilizes a ring Voltage Controlled Oscillator (VCO), which is not suitable for super-high data rate (e.g., higher than 25 Gbps) application, because a jitter as a large portion of a Unit Interval (UI) present in the CDR circuit adversely impacts Bit Error Rate (BER). For example, the CDR may fail to lock to data when a real data rate differs beyond a certain limit (e.g. >5000 ppm) from the expected data rate, and produce incorrect (late/early) detection of clock edge versus data edge. In addition, a chip area required for the CDR circuit and skew variations among multiple phases in the CDR circuit are important factors.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
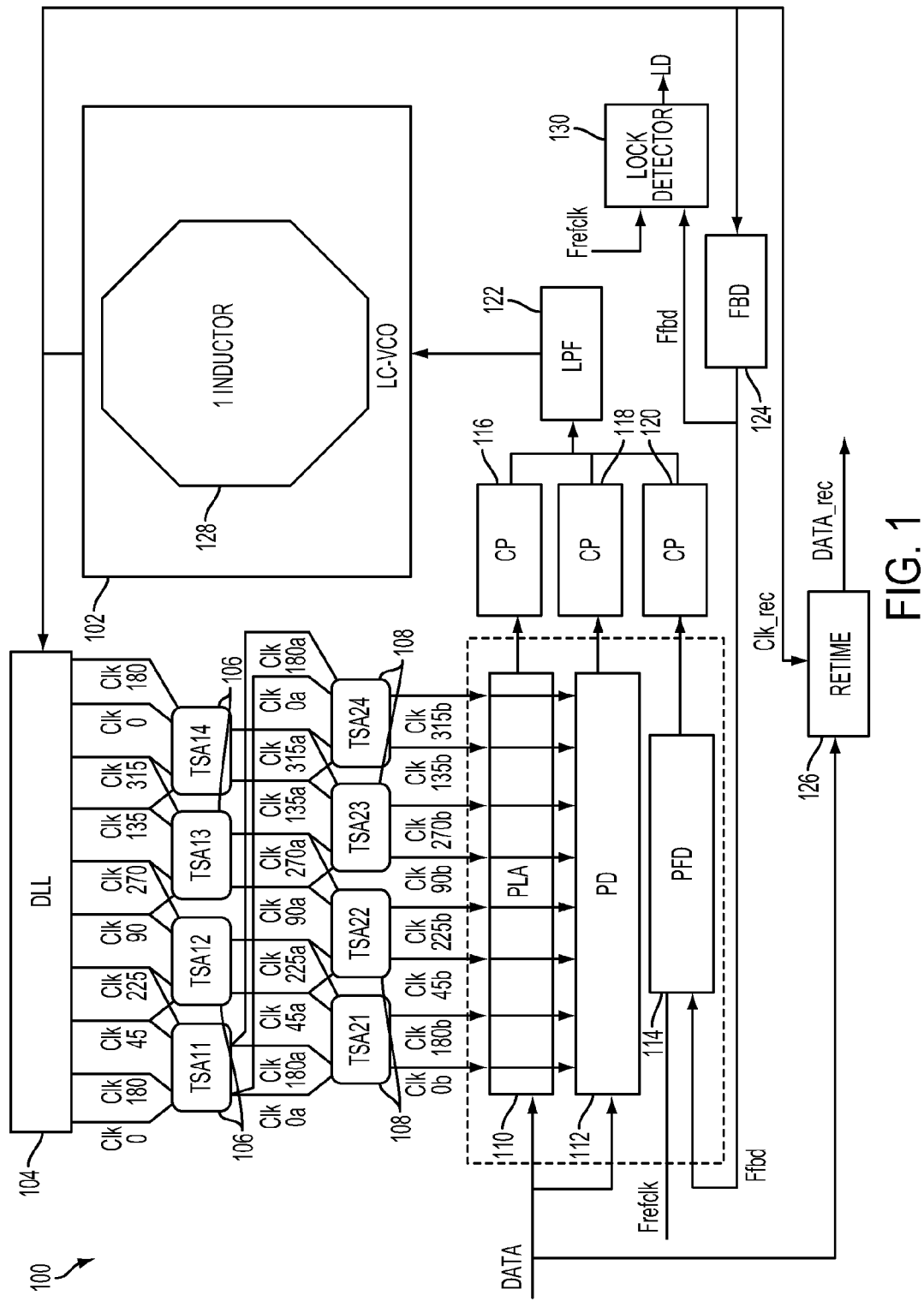
FIG. 1 is a schematic diagram showing an exemplary clock and data recovery (CDR) circuit according to some embodiments.

FIG. 1 is a schematic diagram showing an exemplary clock and data recovery (CDR) circuit according to some embodiments. The CDR circuit 100 includes an inductor-capacitor voltage controlled oscillator (LCVCO) 102 including one inductor 128. The CDR circuit 100 is configured to generate a clock signal with a clock frequency. A delay locked loop (DLL) 104 receives the clock signal from the LCVCO 102 and generates multiple clock phases, e.g., Clk 0, Clk 180, Clk 45, Clk 225, Clk 90, Clk 270, Clk 135, and Clk 315 for an 8 clock phase circuit. The Clk signal numbers represents the 360° phase divided by 8, e.g., 0°, 45°, 90°, 135°, 180°, 225°, 270°, and 315°. Even though 8 clock phases are provided in this example, a different number of clock phases can be provided in other embodiments.

A first timing skew averaging (TSA) circuit 106 receives the multiple clock phases from DLL 104 to supply averaged multiple clock phases, e.g., Clk 0a, Clk 180a, Clk 45a, Clk 225a, Clk 90a, Clk 270a, Clk 135a, and Clk 315a, to reduce phase errors among the multiple clock phases. A second TSA circuit 108 receives the averaged multiple clock phases from the first TSA circuit 106 to supply further averaged multiple clock phases, e.g., Clk 0b, Clk 180b, Clk 45b, Clk 225b, Clk 90b, Clk 270b, Clk 135b, and Clk 315b, to reduce phase errors among the multiple clock phases. The averaged multiple clock phases are received by the phase detector (PD) 112 by way of a phase lock assistant (PLA) circuit 110. Even though two layers of TSA, e.g., 106 and 108, are used in this example, more layers can be used in other embodiments, e.g., three layers of TSA.

Data input is supplied to the PLA 110, PD 112, and a retime circuit 126. A reference clock frequency Frefclk is supplied to a phase frequency detector (PFD) 114. The PLA 110, PD 112, and PFD 114 control charge pumps 116, 118, and 120, respectively. In one embodiment, one of the charge pumps 116, 118, and 120 supplies charges to a low pass filter 122 coupled to the LCVCO 102 at a given time, thus adjusts and controls the clock frequency of the LCVCO 102. In another embodiment, the PLA 110, PD 112, and PFD 114 may share one charge pump through a multiplexer, for example.

A feedback divider (FBD) 124 receives the clock frequency from LCVCO 102, and divides the clock frequency to supply a divided frequency Ffbd to the PFD 114. A lock detector 130 detects if Ffbd is locked to Frefclk and generates a lock detect signal LD. With adjustment of the clock frequency of LCVCO 102 based on the multiple clock phases aligned with data edges of the data input, the clock signal Clk_rec from the LCVCO 102 is supplied to the retime circuit 126 as a recovered clock signal. The retime circuit 126 supplies a recovered data Data_rec by sampling the data input using the recovered clock signal. The operation of the CDR circuit 100 is further described below.

Initially, the PFD 114 detects and compares Frefclk and Ffbd to control the charge pump 120 in order to bring the Ffbd (that is obtained by dividing the clock frequency from LCVCO 102 by using FBD 124) close to the Frefclk. (The lock detector 130 generates the lock detect signal LD.) After accomplishing this, the PLA 110 receives multiple clock phases generated from DLL. The multiple clock phases are averaged through TSA 106 and 108 that supply the averaged multiple clock phases, e.g., Clk 0b, Clk 180b, Clk 45b, Clk 225b, Clk 90b, Clk 270b, Clk 135b, and Clk 315b, to PLA 110.

The PLA fine tunes the clock frequency of LCVCO 102 to align data edges of the received data input (e.g., falling/rising edges of the data input and the multiple clock phases) and controls the charge pump 116 to adjust the clock frequency of LCVCO 102. After accomplishing the fine tuning, the PD 112 keeps tuning the clock frequency of the LCVCO 102 to align data edges of the received data (e.g., falling/rising edges of the data and the multiple clock phases) and controls the charge pump 118 to adjust the clock frequency of LCVCO 102.

The PLA 110 and PD 112 correct early/late detection of the data edge triggered by the clock edge. The PLA 110 is needed for some applications to enable robust clock and data recovery when the data rate varies quite far from the expected data rate (e.g., greater than 5,000 ppm). The PLA 110 is optional, and another embodiment of the CDR circuit 100 does not have the PLA 100. However, in some situations, using only phase detector PD 112 without the PLA 110 to phase lock the received input data and a clock phase, e.g., Clk 90$b$, enables a data edge DE to be close to but not completely aligned with the rising (or falling) edge of clock Clk 90$b$.

The PLA 110 improves the phase lock, e.g., enables the data edge DE to be (substantially) aligned with the rising (or falling) edge of the Clk 90$b$. For example, if the Clk 90$b$ is earlier than input data, the PLA generates a "down" signal for the charge pump 116 to drive the LPF 122 to decrease the clock frequency of the LCVCO 102 to slow down the Clk 90$b$, and thus improves the phase lock. But if the clock phase Clk 90$b$ is later than input data, the PLA 110 generates an "up" signal for the charge pump 116 to drive the LPF 122 to increase the clock frequency of the LCVCO 102 to speed up the Clk 90, and thus improves the phase lock.

In some embodiments, if Ffbd is locked to Frefclk, the LD signal turns off the PFD 114 and turns on the PLA 110 and the PD 112. But if Ffbd is not locked to Frefclk, the LD signal turns on the PFD 114 and turns off the PLA 110 and the PD 112.

The CDR circuit 100 can be used for a high-speed (e.g., higher than 25 Gbps, up to 50 Gbps or beyond, etc.) clock data recovery (CDR) circuit application that requires a low phase noise/jitter and a low timing skew between each clock phase. By using only one inductor 128 (i.e., one LC-Tank) in the clock generating LCVCO 102, substantial chip area is saved compared to other CDR circuits using multiple LCVCOs and inductors. Even though 8 clock phases are generated by the DLL 104 in this example, different number of clock phases can be generated by the DLL 104 in other embodiments. Also, even though two TSA circuits 106 and 108 are used in this example, more TSA circuits, e.g., three TSA circuits, can be used to reduce phase errors even more. The single clock signal output from the LCVCO minimizes the clock trace.

Figure 2:
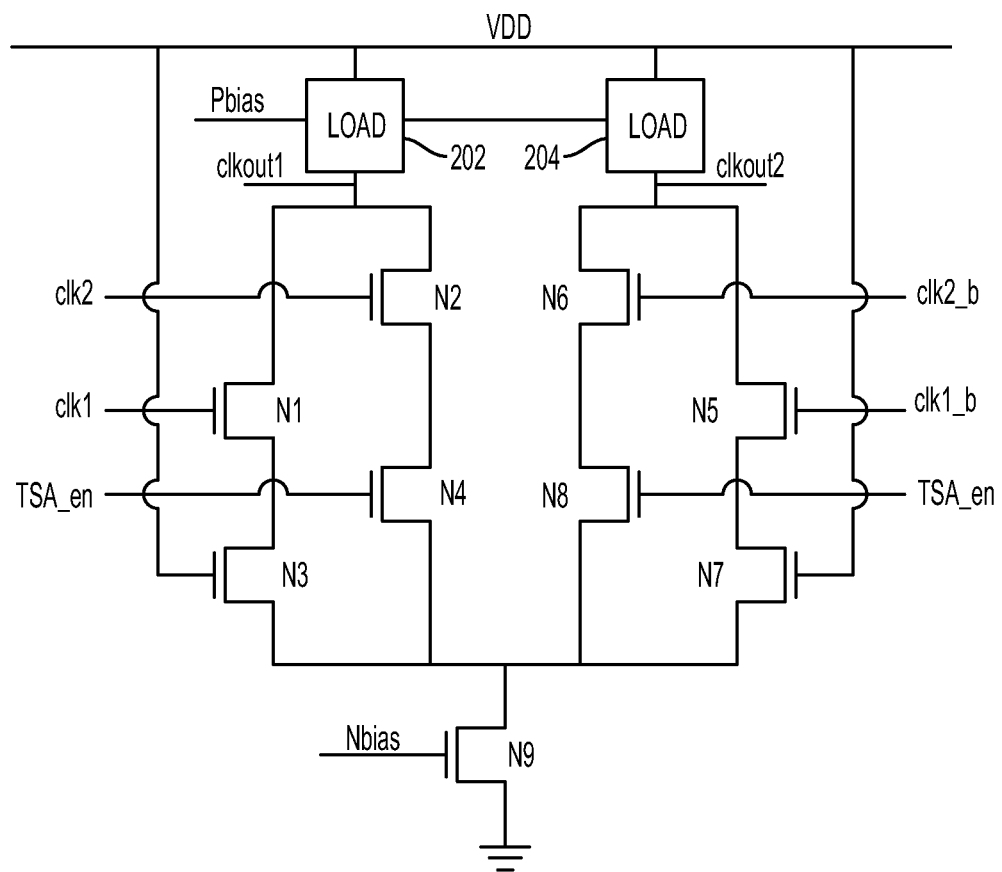
FIG. 2 is a schematic diagram showing an exemplary timing skew averaging (TSA) circuit for the CDR circuit in FIG. 1 according to some embodiments.

FIG. 2 is a schematic diagram showing an exemplary timing skew averaging (TSA) circuit for the CDR circuit in FIG. 1, e.g., TSA 106 or 108, according to some embodiments. The loads 202 and 204 are coupled to a power supply voltage VDD and controlled by a voltage Pbias. Clock phase signals clk1 and clk2 are supplied to the gates of NMOS transistors N1 and N2, respectively. The NMOS transistor N2 is connected in series with an NMOS transistor N4 that is controlled by the TSA enable (TSA_en) signal. The NMOS transistor N1 is connected in series with an NMOS transistor N3 to balance the signal travel paths between the two paths through NMOS transistors N1 and N2.

Likewise, clock phase signals clk1_$b$ and clk2_$b$ are supplied to the gates of NMOS transistors N5 and N6, respectively. The clk1_$b$ and clk2_$b$ are out of phase with clk1 and clk2 by 180°, respectively. The NMOS transistor N6 is connected in series with an NMOS transistor N8 that is controlled by the TSA enable (TSA_en) signal. The NMOS transistor N5 is connected in series with an NMOS transistor N7 to balance the signal travel paths between the two paths through NMOS transistors N5 and N6.

The clk1 and clk2 can be, for example, Clk 0 and Clk 45 in FIG. 1. In such an instance, clk1_$b$ and clk2_$b$ are Clk 180 and Clk 225. The output signal clkout1 is provided as an average of the clock phase signals of Clk 0 and Clk 45 and the output signal clkout2 is provided as an average of the clock phase signals of Clk 180 and Clk 225. A voltage Nbias controls the current through an NMOS transistor N9. The load 202 controls the voltage range of clkout1. Assuming the current through the load 202 is I1 and its resistance R1, the clkout1 voltage ranges from (VDD−R1×I1) to VDD. The load 204 controls the voltage range of clkout2. Assuming the current through the load 204 is I2 and its resistance R2, the clkout2 voltage ranges from (VDD−R2×I2) to VDD.

Figure 3:
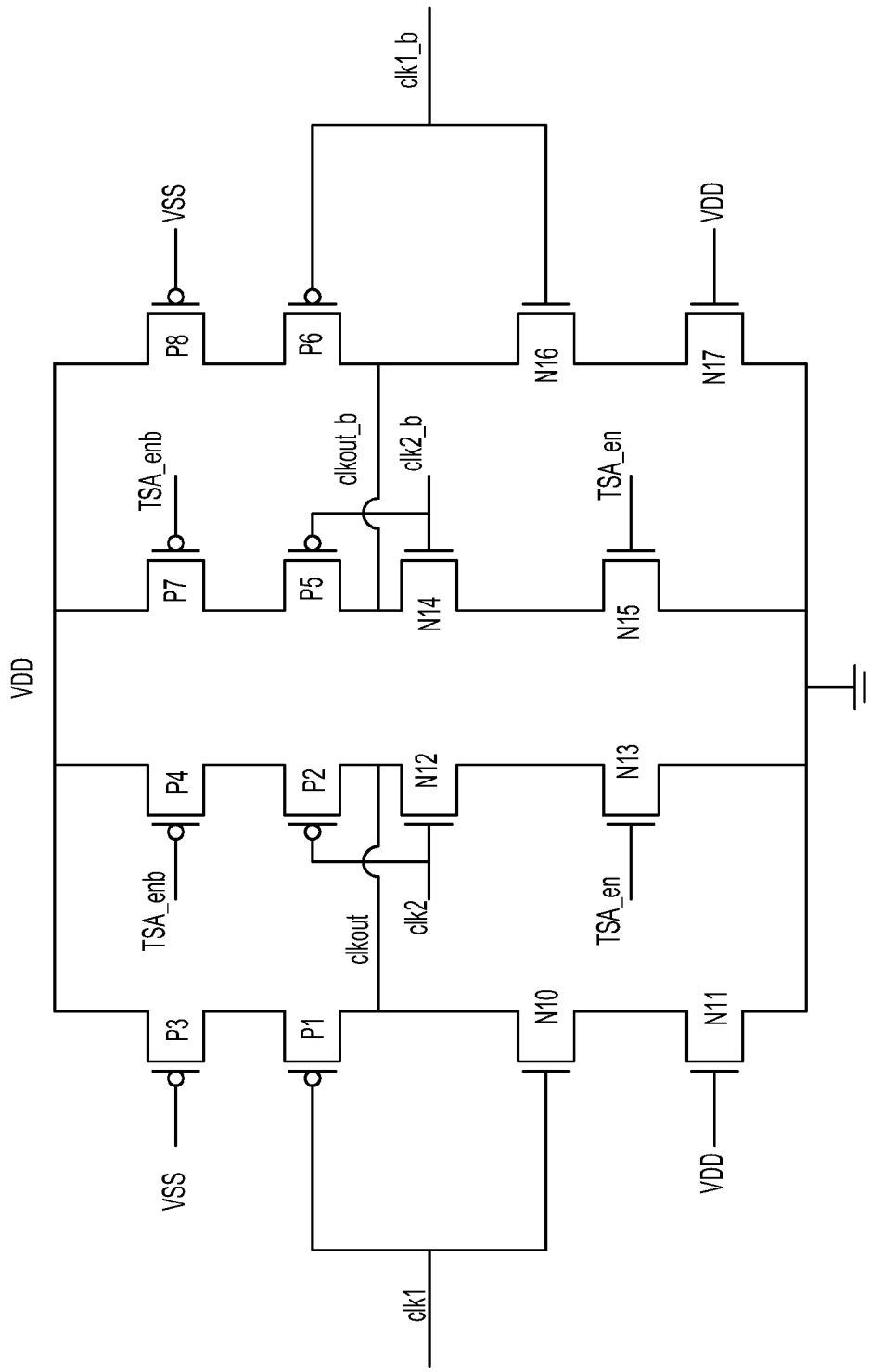
FIG. 3 is a schematic diagram showing another exemplary timing skew averaging (TSA) circuit for the CDR circuit in FIG. 1 according to some embodiments.

FIG. 3 is a schematic diagram showing another exemplary timing skew averaging (TSA) circuit for the CDR circuit in FIG. 1, e.g., TSA 106 or 108, according to some embodiments. VSS is a low power supply voltage, e.g., a ground. Clock phase signal clk1 is supplied to the gates of NMOS transistor N10 and PMOS transistor P1. Clock phase signal clk2 is supplied to the gates of NMOS transistor N12 and PMOS transistor P2. The NMOS transistor N12 is connected in series with an NMOS transistor N13 that is controlled by the TSA enable (TSA_en) signal. The NMOS transistor N10 is connected in series with an NMOS transistor N11 to balance the signal travel paths between the two paths through NMOS transistors N10 and N12. The PMOS transistor P2 is connected in series with a PMOS transistor P4 that is controlled by the TSA enable complementary (TSA_enb) signal. The PMOS transistor P1 is connected in series with a PMOS transistor P3 to balance the signal travel paths between the two paths through PMOS transistors P1 and P2. The clk1 and clk2 can be, for example, Clk 0 and Clk 45 in FIG. 1. The output signal clkout is provided as an average of the clock phase signals of Clk 0 and Clk 45.

Likewise, clock phase signals clk1_$b$ and clk2_$b$ are supplied to the gates of NMOS transistor N14 and PMOS transistor P5 and to NMOS transistor N16 and PMOS transistor P6, respectively. The clk1_$b$ and clk2_$b$ are out of phase with clk1 and clk2 by 180° (i.e., complementary signals), respectively. The NMOS transistor N14 is connected in series with an NMOS transistor N15 that is controlled by the TSA enable (TSA_en) signal. The NMOS transistor N16 is connected in series with an NMOS transistor N17 to balance the signal travel paths between the two paths through NMOS transistors N14 and N16. The PMOS transistor P5 is connected in series with a PMOS transistor P7 that is controlled by the TSA enable complementary (TSA_enb) signal. The PMOS transistor P6 is connected in series with a PMOS transistor P8 to balance the signal travel paths between the two paths through PMOS transistors P5 and P6. The clk1 and clk2 can be, for example, Clk 0 and Clk 45 in FIG. 1. In such an example, the clk1_$b$ and clk2_$b$ are Clk 180 and Clk 225. The output signal clkout is provided as an average of the clock phase signals of Clk 0 and Clk 45 and the output signal clkout_b is provided as an average of the clock phase signals of Clk 180 and Clk 225.

Figure 4:
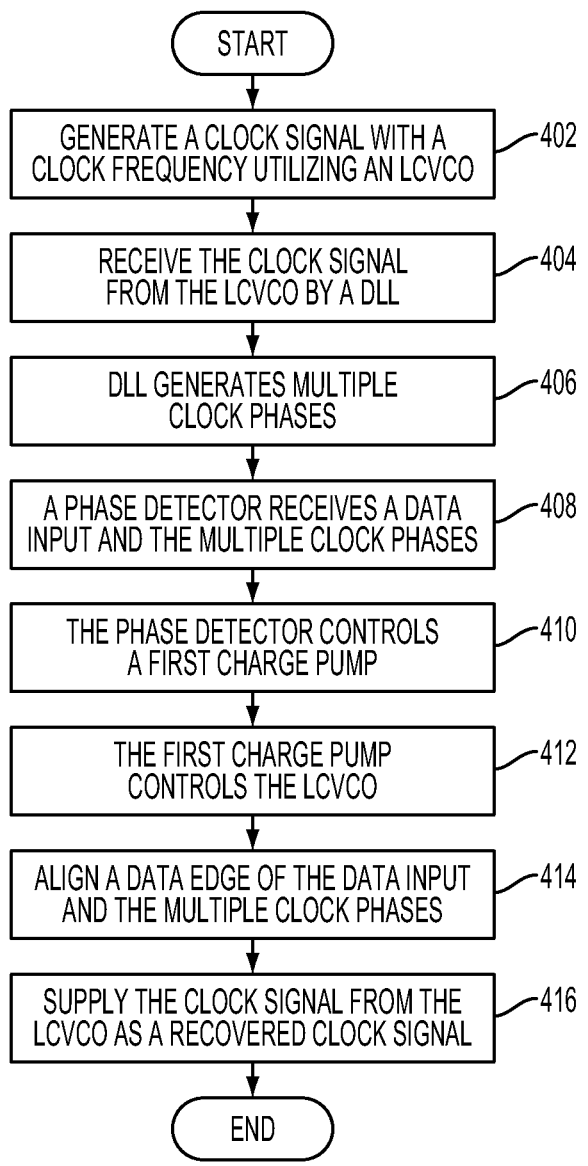
FIG. 4 is a flowchart of a method for the exemplary CDR circuit in FIG. 1 according to some embodiments.

FIG. 4 is a flowchart of a method for the exemplary CDR circuit in FIG. 1 according to some embodiments. At step 402, a clock signal is generated with a clock frequency utilizing an inductor-capacitor voltage controlled oscillator (LCVCO). At step 404, the clock signal is received from the LCVCO by a delay locked loop (DLL). At step 406, the DLL generates multiple clock phases. At step 408, a phase detector (PD) receives a data input and the multiple clock phases. At step 410, the PD controls a first charge pump (i.e., supplies a signal to the first charge pump). At step 412, the first charge pump controls the LCVCO (i.e., supplies a signal to the LCVCO).

At step 414, a data edge of the data input and the multiple clock phases are aligned. At step 416, the clock signal from the LCVCO is supplied as a recovered clock signal.

In various embodiments, the multiple clock phases are averaged utilizing a first timing skew averaging (TSA) circuit coupled between the DLL and the PD. The multiple averaged clock phases from the first TSA circuit can be further averaged utilizing a second TSA circuit coupled between the first TSA circuit and the phase detector.

In various embodiments, a feedback divider (FBD) divides an LCVCO frequency to supply the divided frequency clock Ffbd to the PFD. A low pass filter (LPF) is coupled between the first charge pump and the LCVCO. A retime circuit coupled to the LCVCO receives the data input. The retime circuit supplies a recovered data output.

In various embodiments, a phase locked assistant (PLA) circuit receives the data input and the multiple clock phases. The PLA controls a second charge pump. The second charge pump controls the LCVCO prior to the first charge pump controlling the LCVCO.

In various embodiments, a phase frequency detector (PFD) receives a reference frequency clock Frefclk and the divided frequency clock Ffbd. The PFD controls a third charge pump. The third charge pump controls the LCVCO prior to the second charge pump controlling the LCVCO.

One aspect of this description relates to a clock and data recovery (CDR) circuit. The CDR circuit includes an inductor-capacitor voltage controlled oscillator (LCVCO) configured to generate a clock signal with a clock frequency. The CDR circuit further includes a delay locked loop (DLL) configured to receive the clock signal from the LCVCO and generate multiple clock phases and a first charge pump configured to control the LCVCO. The CDR circuit further includes a phase detector configured to receive a data input and the multiple clock phases from the DLL, and to align a data edge of the data input and the multiple clock phases.

Another aspect of this description relates to a method of recovering clock and data for a clock and data recovery (CDR) circuit. The method includes generating a clock signal with a clock frequency utilizing an inductor-capacitor voltage controlled oscillator (LCVCO). The method further includes generating multiple clock phases based on the clock signal using a delay locked loop (DLL). The method further includes controlling a first charge pump using a phase detector, controlling the LCVCO using the first charge pump, and aligning a data edge of a data input and the multiple clock phases using the phase detector.

Still another aspect of this description relates to a clock and data recovery (CDR) circuit. The CDR circuit includes an inductor-capacitor voltage controlled oscillator (LCVCO) configured to generate a clock signal with a clock frequency. The CDR circuit further includes a delay locked loop (DLL) configured to receive a clock signal from the LCVCO and generate multiple clock phases. The CDR circuit further includes a first timing skew averaging (TSA) circuit coupled to the DLL, the first TSA circuit configured to average the multiple clock phases. The CDR circuit further includes a phase detector configured to receive a data input and the multiple clock phases from the DLL via the first TSA circuit, and to align a data edge of the data input and the multiple clock phases.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A clock and data recovery (CDR) circuit, comprising:
   an inductor-capacitor voltage controlled oscillator (LCVCO) configured to generate a clock signal with a clock frequency;
   a delay locked loop (DLL) configured to receive the clock signal from the LCVCO and generate multiple clock phases;
   a first charge pump configured to control the LCVCO; and
   a phase detector configured to receive a data input and the multiple clock phases from the DLL, and to align a data edge of the data input and the multiple clock phases.

2. The CDR circuit of claim 1, wherein each clock phase of the multiple clock phases are selected from the group consisting of 0°, 45°, 90°, 135°, 180°, 225°, 270° and 315°.

3. The CDR circuit of claim 1, further comprising:
   a first timing skew averaging (TSA) circuit coupled between the DLL and the phase detector, the first TSA circuit configured to output first average the multiple clock phases; and
   a second TSA circuit coupled between the first TSA and the phase detector, the second TSA configure to receive the first average multiple clock phases and to output second average multiple clock phases.

4. The CDR circuit of claim 3, wherein the first TSA circuit comprises:
   a first load connected to an operating voltage;
   a first transistor connected to the first load and configured to receive a first clock signal;
   a second transistor connected to the first load in parallel with the first transistor, the second transistor configured to receive a second clock signal;
   a second load connected to the operating voltage and to the first load;
   a third transistor connected to the second load and configured to receive a third clock signal out of phase with the first clock signal by 180°; and
   a fourth transistor connected to the second load in parallel with the third transistor, the fourth transistor configured to receive a fourth clock signal out of phase with the second clock signal by 180°.

5. The CDR circuit of claim 4, wherein the first TSA circuit further comprises:
   a first resistive transistor connected to the first transistor and configured to be permanently conductive;
   a first enable transistor connected to the second transistor and configured to receive an enable signal;

a second resistive transistor connected to the third transistor and configured to be permanently conductive; and a second enable transistor connected to the fourth transistor and configured to receive the enable signal.

6. The CDR circuit of claim 3, wherein the second TSA circuit comprising:
   a first transistor pair configured to receive a first clock signal;
   a second transistor pair configured to receive a second clock signal, the second transistor pair connected in parallel with the first transistor pair;
   a third transistor pair configured to receive a third clock signal out of phase with the first clock signal by 180°; and
   a fourth transistor pair configured to receive a fourth clock signal out of phase with the second clock signal by 180°, the fourth transistor pair connected in parallel with the third transistor pair.

7. The CDR circuit of claim 6, wherein the first transistor pair is connected in parallel with the third transistor pair.

8. The CDR circuit of claim 6, where the second TSA circuit further comprises:
   a first resistive transistor between the first transistor pair and an operating voltage;
   a second resistive transistor between the first transistor pair and a ground voltage;
   a first enable transistor configured to receive an enable signal, the first enable transistor between the second transistor pair and the operating voltage;
   a second enable transistor configured to receive a complementary enable signal, the second enable transistor between the second transistor pair and the ground voltage;
   a third resistive transistor between the third transistor pair and the operating voltage;
   a fourth resistive transistor between the third transistor pair and the ground voltage;
   a third enable transistor configured to receive the enable signal, the third enable transistor between the fourth transistor pair and the operating voltage; and
   a fourth enable transistor configured to receive the complementary enable signal, the fourth enable transistor between the fourth transistor pair and the ground voltage.

9. The CDR circuit of claim 1, further comprising a lock detector configured to receive a divided feedback from the LCVCO and a reference clock frequency and to generate a lock detect signal.

10. The CDR circuit of claim 1, wherein the LCVCO comprises a single inductor.

11. A method of recovering clock and data for a clock and data recovery (CDR) circuit, comprising:
   generating a clock signal with a clock frequency utilizing an inductor-capacitor voltage controlled oscillator (LCVCO);
   generating multiple clock phases based on the clock signal using a delay locked loop (DLL);
   controlling a first charge pump using a phase detector;
   controlling the LCVCO using the first charge pump; and
   aligning a data edge of a data input and the multiple clock phases using the phase detector.

12. The method of claim 11, further comprising averaging the multiple clock phases, wherein averaging the multiple clock phases comprises:
   generating first average multiple clock phases using a first timing skew averaging (TSA) circuit; and
   generating second multiple clock phases using a second TSA circuit connected in series with the first TSA circuit.

13. The method of claim 11, wherein generating multiple clock phases comprises generating multiple clock phases selected from the group consisting of 0°, 45°, 90°, 135°, 180°, 225°, 270° and 315°.

14. The method of claim 11, further comprising generating a lock detect signal using a lock detector receiving a divided feedback from the LCVCO and a reference clock frequency.

15. The method of claim 11, wherein generating the clock signal comprises using a single inductor LCVCO.

16. A clock and data recovery (CDR) circuit, comprising:
   an inductor-capacitor voltage controlled oscillator (LCVCO) configured to generate a clock signal with a clock frequency;
   a delay locked loop (DLL) configured to receive a clock signal from the LCVCO and generate multiple clock phases;
   a first timing skew averaging (TSA) circuit coupled to the DLL, the first TSA circuit configured to average the multiple clock phases; and
   a phase detector configured to receive a data input and the multiple clock phases from the DLL via the first TSA circuit, and to align a data edge of the data input and the multiple clock phases.

17. The CDR circuit of claim 16, wherein each clock phase of the multiple clock phases are selected from the group consisting of 0°, 45°, 90°, 135°, 180°, 225°, 270° and 315°.

18. The CDR circuit of claim 16, further comprising:
   a second TSA circuit coupled between the first TSA and the phase detector, the second TSA configure to receive the average multiple clock phases and to output second average multiple clock phases.

19. The CDR circuit of claim 16, further comprising a lock detector configured to receive a divided feedback from the LCVCO and a reference clock frequency and to generate a lock detect signal.

20. The CDR circuit of claim 16, wherein the LCVCO comprises a single inductor.

* * * * *